United States Patent [19]

Dagnac et al.

[11] Patent Number: 5,486,681
[45] Date of Patent: Jan. 23, 1996

[54] DEVICE FOR HEATING UP ELECTRONIC BOARDS

[75] Inventors: Pierre Dagnac, Tournefeuille; Michel Leviandier, St Orens de Grameville; Jean-Philippe Tigneres, Toulouse, all of France

[73] Assignee: Thomson-CSF, Paris, France

[21] Appl. No.: 256,166

[22] PCT Filed: Oct. 29, 1993

[86] PCT No.: PCT/FR93/01075

§ 371 Date: Jun. 24, 1994

§ 102(e) Date: Jun. 24, 1994

[30] Foreign Application Priority Data

Oct. 29, 1992 [FR] France .................... 92 12950

[51] Int. Cl.⁶ .................................................. F27D 7/04
[52] U.S. Cl. ...................... 219/400; 219/385; 361/690
[58] Field of Search ................................ 219/385, 386, 219/389–393, 396, 398–400, 402, 403, 209, 229, 388; 265/64; 126/21 A, 21 R; 361/383, 390, 384, 391, 415

[56] References Cited

U.S. PATENT DOCUMENTS

| 4,374,316 | 2/1983 | Inamori et al. | 219/209 |
| 4,985,803 | 1/1991 | Pum et al. | 361/383 |
| 5,010,233 | 4/1991 | Henschen et al. | 219/209 |
| 5,268,558 | 12/1993 | Youssef et al. | 219/209 |

FOREIGN PATENT DOCUMENTS

| 0059410 | 3/1984 | European Pat. Off. . |
| 0377425 | 7/1990 | European Pat. Off. . |
| 0484852 | 5/1992 | European Pat. Off. . |
| 3097299 | 7/1991 | Japan . |
| 1196620 | 7/1970 | United Kingdom . |
| 2198593 | 6/1988 | United Kingdom . |

Primary Examiner—Tu Hoang
Attorney, Agent, or Firm—Meltzer, Lippe, Goldstein, et al.

[57] ABSTRACT

A device for heating up electronic boards to be mounted between opposing board-guide walls having parallel guidance grooves therein and a back allowing for interconnections. The device comprises a heating element arranged in at least one of the board-guide walls on a side which is opposite to the guidance grooves, heat exchange fins associated with the heating element, and vents in the board-guide walls arranged between the guidance grooves. This arrangement allows for the circulation of heated air by the fins between the boards by natural or forced convection.

8 Claims, 2 Drawing Sheets

DEVICE FOR HEATING UP ELECTRONIC BOARDS

BACKGROUND OF THE INVENTION

The present invention relates to a device for heating up electronic boards arranged in board-guides and between which a circulation of air is possible.

Generally, these electronic boards, whatever their dimensions, thickness, component technologies, etc. or their constituent substance, may be intended to operate inside electronic cabinets, computers or various other hardware. This hardware may be used in certain cases in harsh climatic environments and in particular at very low temperatures, possibly down to −55° to 60° C. Many components, and in particular the so-called non civilian components, do not operate or operate poorly at such temperatures. It is therefore necessary to raise their temperature to a value sufficient to allow the rapid start-up and correct operation of the electronic boards.

It is known in certain cases to provide each integrated circuit with its own heating means (resistor wire for example). However, such a solution is expensive since it requires the use of specially modified components.

The purpose of the present invention is to allow the heating up of standard electronic boards using conventional components without any modification.

A subject of the invention is therefore a device for heating up electronic boards which is simple by virtue of a suitable layout of the board-support and mounting assemblies.

SUMMARY OF THE INVENTION

According to the invention, there is therefore provided a device for heating up electronic boards mounted between opposing board-guide walls containing parallel guidance grooves and a back allowing for the interconnections, said device being characterized in that a heating element is arranged on at least one of the board-guide walls, on the opposite face to the grooves, in that convection means are associated with the heating element and in that said board-guide walls contain vents arranged between the grooves so as to allow for the circulation of the heated air between the electronic boards.

Thus, the device applies to any type of board without modification to the latter. Moreover, heat-up is all the more effective since it is undertaken from both sides of each board, thus enabling the components to be heated through the body and through the tabs, independently of the direction of mounting.

BRIEF DESCRIPTION OF THE DRAWINGS

The invention will be better understood and other characteristics and advantages will emerge with the aid of the description below and the attached drawings in which.

DETAILED DESCRIPTION OF PREFERRED EMBODIMENTS

Figure 1:
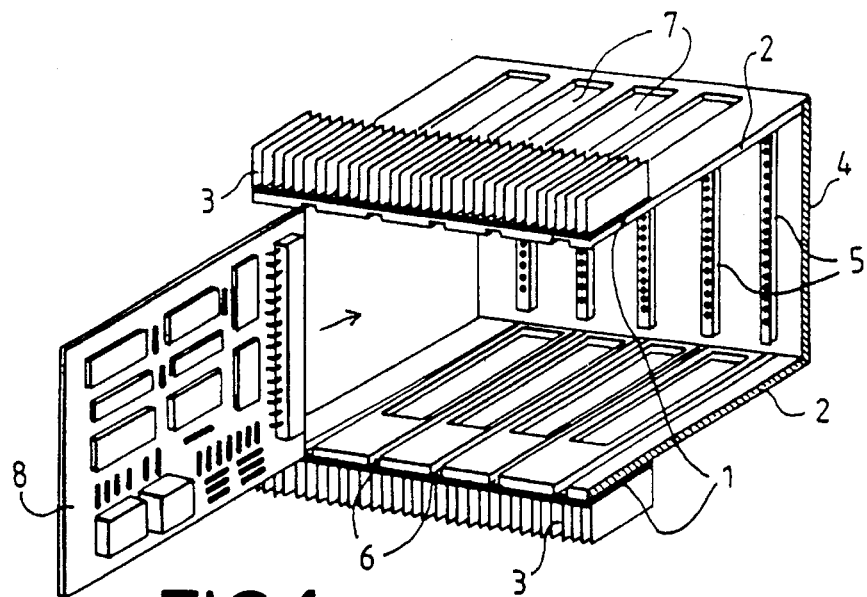
FIG. 1 is a perspective view of an embodiment of the device according to the invention.

FIG. 1 shows in perspective an assembly for mounting electronic boards, which is modified so as to constitute the heating-up device according to the invention.

Throughout the description, the term "electronic board" is understood as any type of board carrying a certain number of electronic components connected together to form a circuit, for example a printed-circuit board, whatever the dimensions, thickness, component technologies and constructional technologies and whatever the constituent substance of the board (glass epoxy, composite epoxy, polyamide ceramic, etc.). The electronic boards 8 are fitted for mounting and retention into guidance grooves 6 of opposing board-guide walls 2. These walls are connected to a back 4, motherboard or backplane, furnished with connectors 5 for receiving the corresponding male connectors of the boards. This back 4 is provided so as to allow for the necessary interconnections. In order to allow for the heating-up of the boards according to the invention, there is provision for arranging a heating element 1 on the board-guide walls 2 on the face away from the grooves. This element can be a resistive film or support or else a device for circulating heat-carrying fluid or a Peltier-effect device or any other known means of heating. This heating element 1 can be fixed to the wall 2 by any means, such as cementing, riveting, retention by screws or by bearing plate, etc.

This heating element is fixed along that side of the wall 2 away from the back 4. The board-guide wall is made from a metallic material or one which is a good conductor of heat.

A convection means such as fins 3 made from metal (for example aluminium) or any other material which is a good thermal conductor is associated with the heating element 1. Vents 7 allowing passage of the air heated by the fins 3 are drilled in the wall 2, between the grooves 6, between the element 1 with the fins 3 and the back 4.

By virtue of these vents, the heated air can circulate between the boards 8 inserted into the grooves 6 and heat up the components which they carry. Of course, the heating element 1 and the fins 3 could be arranged differently on the board-guide wall 2, for example in any position between the back 4 and that side of the wall 2 away from this back. In this case the vents could be distributed on either side of the fins 3.

The heating-up device according to the invention provides for the heating-up of the components in various possible heat exchange modes:

by conduction of the metallic or good thermally-conducting masses; this mode is all the more effective if the electronic boards are furnished with heat sinks (that is to say with a layer, generally metallic, covering the whole of the board whilst leaving room for the tabs of the components and of the connectors);

by radiation from the heating element into the nearby environment;

by natural convection above all.

Figure 2:
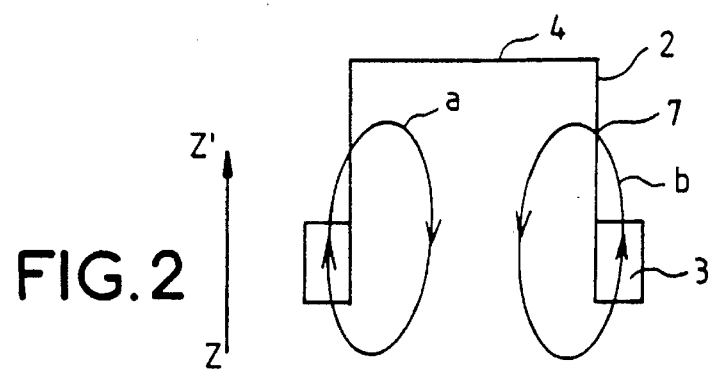
FIG. 2 is a basic diagram of the device under natural convection.

In the case where these heat exchange modes alone are used, natural convection is to be favoured, this being obtained according to the diagram of FIG. 2. In this diagram it is seen that the board-guide walls 2 have been arranged vertically along the zz' axis, the back 4 being uppermost. The heated air in contact with the fins 3 circulates according to the arrows a and b, passing through the vents 7 and then between the boards.

Figure 3:
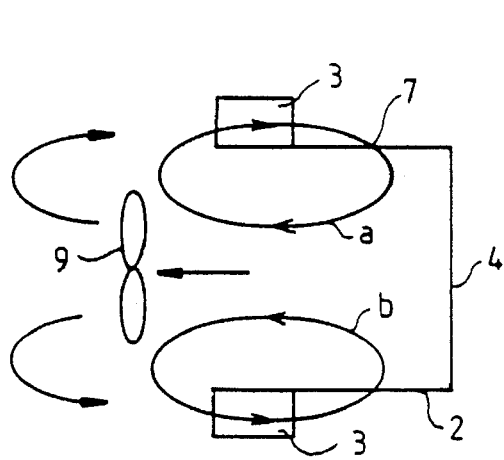
FIGS. 3 and 4 show a basic diagram of the device under forced convection.
Figure 4:
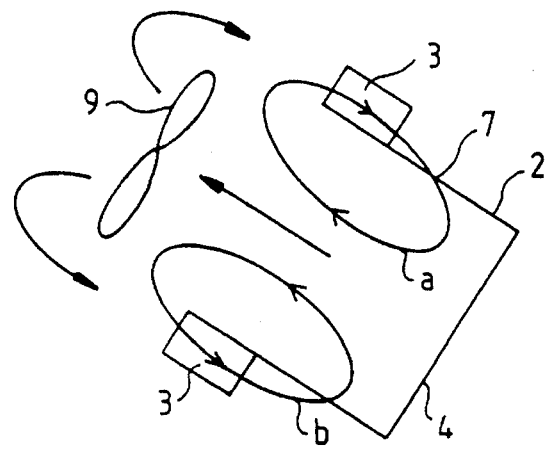

The effectiveness and flexibility of use of the device according to the invention can be further improved by providing forced convection. To do this, one or more fans 9 or turbines are arranged in the natural convection loops a and b, as represented in FIGS. 3 or 4. The fans 9 are for example arranged away from the back 4 with respect to the boards. These fans accelerate the circulation of air and, since the circulation is forced, the position of the assembly in space can be arbitrary. Thus FIGS. 3 and 4 represent two possible different positions.

It is clear that, in all cases, the thermal power of the heating element, the surface area of the fins and their number and position, and the cross-section of the vents are determined on the basis of the boards and components used, of the low initial temperature, of the desired start-up time from the low temperature, of the volume and overall heat capacity of the cabinet.

Figure 5:
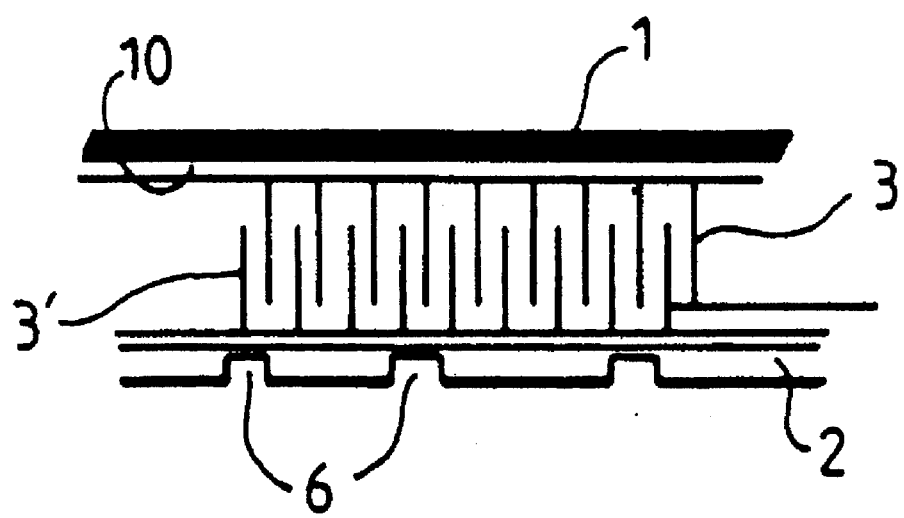
FIG. 5 illustrates one part of a variant of the device according to the invention.

FIG. 5 represents partially a variant of the device according to the invention, more particularly adapted to the case of forced convection. In this variant, the heating element I is arranged on a support 10 rather than directly on the board-guide wall 2. The support 10 should be such that the fins 3 associated with the heating element 1 lie within the forced circulation current of air to the vents and boards.

These fins 3 can be used alone or else another set of fins 3' can be provided, as in FIG. 5, fixed to the board-guide wall 2 and interposed between the fins 3 so as to improve heat exchange to the wall 2 and, by conduction, to the boards 8 and their possible heat sinks.

Obviously the heating-up device is set going and stopped with the aid of any thermal regulation circuit on the basis of the temperature required for correct operation of the components.

Of course, the embodiments described in no sense limit the invention.

We claim:

1. Device for heating up electronic boards comprising opposing board-guide walls with each having parallel guidance grooves for inserting said electronic boards therein, a back for interconnecting said walls, a heating element arranged on at least one of said board-guide walls on a side of a first board-guide wall opposite to said grooves, convection means associated with said heating element, and vents arranged in each of said board-guide walls with each of said vents located between said grooves so as to allow a circulation of heated air between said electronic boards.

2. Device according to claim 1 wherein said heating element is arranged on said first board-guide wall at a location which is remote from said back.

3. Device according to claim 2 wherein said device is oriented so that said board-guide walls are arranged vertically and said back is situated on top, and heating of said electronic boards occurs by a natural convection in which the heated air is circulated over said convection means and passed through said vents and between said electronic boards.

4. Device according to claim 1 further comprising means for creating a forced convection by accelerated circulation of the heated air between said electronic boards, said means for creating a forced convection being arranged in loops of natural circulation of the heated air between the boards, the vents, and the convection means.

5. Device according to claim 4 wherein said means for creating a forced convection comprises at least one fan arranged away from said back with respect to the electronic boards.

6. Device according to claim 1 wherein said convection means comprises fins made from a material which is a heat conductor, said fins being arranged parallel to said grooves on said heating element.

7. Device according to claim 6 wherein said heating element comprises a resistive film arranged on said first board-guide wall at a location remote from said back.

8. Device for heating electronic boards comprising opposing board guide-walls, each having parallel guidance grooves for inserting said electronic boards therein, a back allowing for interconnecting said walls, vents arranged in each of said board guide-walls with each of said vents located between said grooves, means for creating a forced convection by accelerated circulation of air along a path which passes through said vents and between said board guide-walls, and a heating element associated with a convection means and arranged so that said convection means is situated in the path of said circulation of air.

* * * * *